United States Patent
Ryding et al.

(10) Patent No.: US 6,268,609 B1
(45) Date of Patent: Jul. 31, 2001

(54) APPARATUS AND METHOD FOR REDUCING HEATING OF A WORKPIECE IN ION IMPLANTATION

(75) Inventors: Geoffrey Ryding, Manchester; Theodore H. Smick, Essex; Marvin Farley, Ipswich, all of MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/293,938

(22) Filed: Apr. 19, 1999

(51) Int. Cl.$^7$ .................................................. H01J 37/317
(52) U.S. Cl. ................... 250/492.21; 250/442.11
(58) Field of Search ........................ 250/492.21, 442.11

(56) References Cited

U.S. PATENT DOCUMENTS

| 5,003,183 | 3/1991 | Nagami et al. | 250/492.2 |
|---|---|---|---|
| 5,194,748 | * 3/1993 | Aitken | 250/442.11 |
| 5,229,615 | 7/1993 | Brune et al. | 250/492.2 |
| 5,929,456 | * 7/1999 | Tamai | 250/492.21 |

FOREIGN PATENT DOCUMENTS

WO99/13488    9/1998   (WO).

OTHER PUBLICATIONS

"Wafer Cooling in a High Current ion Implanter".

* cited by examiner

Primary Examiner—Jack Berman
(74) Attorney, Agent, or Firm—Boult Wade Tennant

(57) ABSTRACT

An apparatus and method for reducing heating of a workpiece during ion implantation. The method comprises generating an ion beam for implantation of ions into a workpiece is, the workpiece having a surface defining a plane; scanning the ion beam relative to the surface of the workpiece in a first direction in the plane; repeatedly reciprocating the workpiece in a second direction transverse to the first direction to traverse to and from through the scanned ion beam; and rotating the workpiece 180 degrees about a central axis of the workpiece between each successive traverse of the wafer through the scanned ion beam, so that the wafer always presents the same leading edge to the beam on each traverse.

5 Claims, 3 Drawing Sheets

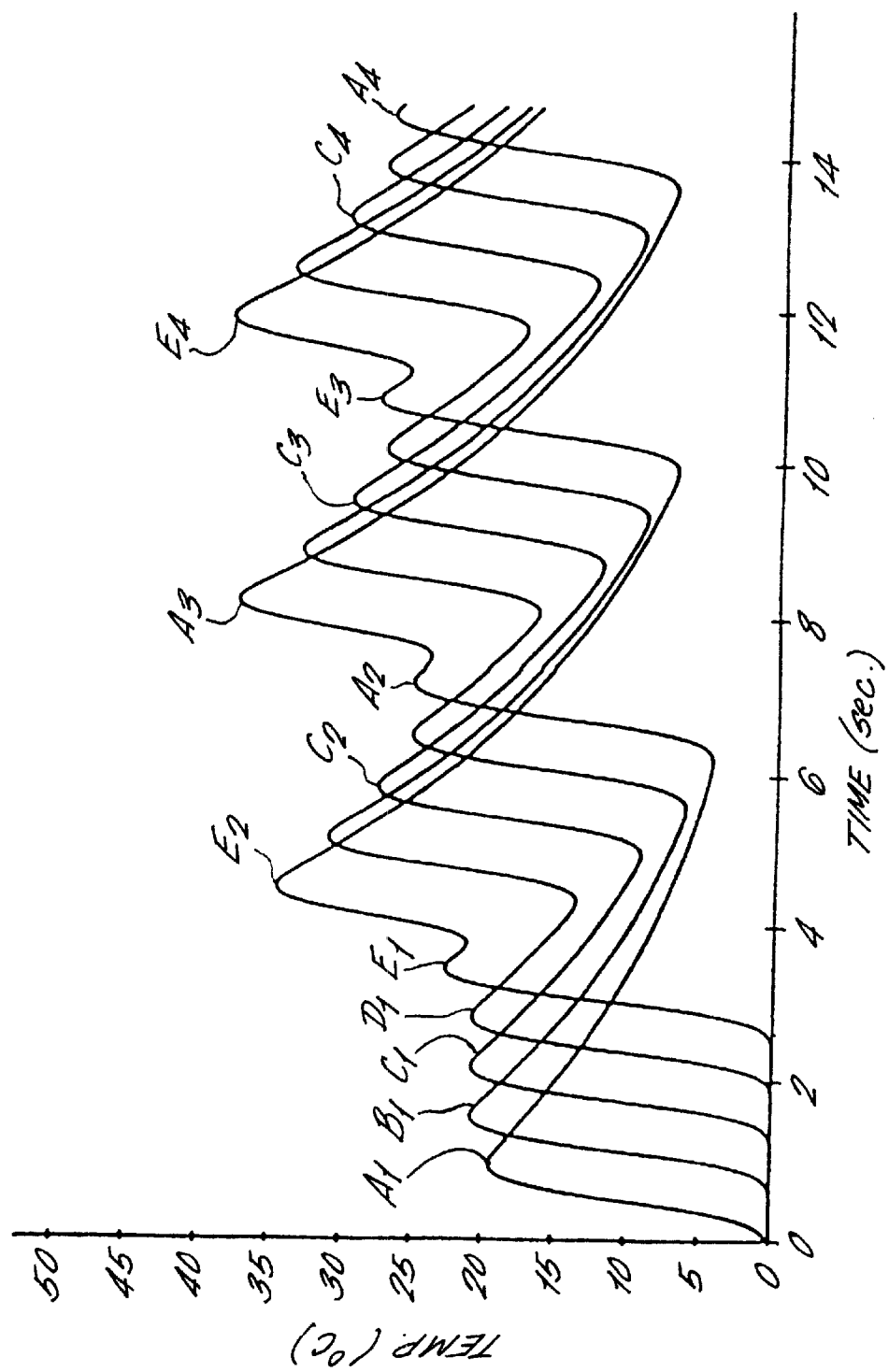

APPARATUS AND METHOD FOR REDUCING HEATING OF A WORKPIECE IN ION IMPLANTATION

FIELD OF THE INVENTION

The present invention relates to ion implantation processes for implanting ions into a workpiece, such as wafers or substrates, in the fabrication of semiconductor devices. More specifically, the present invention relates to reducing the heating of a surface of a wafer in a ion implanter during ion implantation processing

BACKGROUND OF THE INVENTION

Ion implantation techniques are commonly used as one of the processes in the manufacture of integrated circuits. Ion implanters are used to modify the electrical transport properties, i.e. conductivity, in predefined regions of semiconductor material by doping the predefined regions with impurity atoms. Ion implantation techniques generally involve generating a beam of a particular species of ions in an ion beam generator and directing the ion beam through a vacuum chamber into a target wafer supported on a substrate holder or platen assembly. The ion beam may be scanned across the wafer using either electrostatic and/or magnetic deflection of the ion beam. Other ion implantation systems involve either mechanically scanning the wafer relative to the ion beam or a combination of mechanical scanning of the wafer with electrostatic and/or magnetic deflection of the ion beam. Ion implanters for processing single wafers one after the other often use a hybrid scanning system in which the beam is scanned at a relatively fast rate in one direction across the wafer and the wafer is mechanically reciprocated to and fro in a transverse direction through the scanned beam.

In any of these systems, and in particular in high current and/or high energy ion implantation applications, during processing, the temperature at any point on the surface of the wafer may rise to a temperature that causes damage to the structures thereon. The temperature of the surface of the wafer at any point is a function of the ion beam power and the technique used for ion beam scanning and/or wafer scanning. Steps have been taken in the prior art to limit the maximum temperature at the surface of the substrate during processing. These attempts to limit wafer surface temperature include for example the use of wafer clamping systems to clamp wafers to a heat sinking surface and to enhance thermal conductance through the back surface of the wafer. In spite of these known wafer cooling systems, wafer processing speeds may still be limited by the need to avoid overheating the wafer or parts thereof.

SUMMARY OF THE INVENTION

An object of an embodiment of the invention is to provide a method and apparatus for reducing the maximum temperature reached on the surface of a wafer, and each point on the surface of the wafer experiencing substantially the same thermal cycle on each mechanical scan, during ion implantation when using single wafer implanters using hybrid scanning systems.

According to the invention there is provided a method for ion implantation of a workpiece in an ion implanter, comprising the steps of generating an ion beam for implantation of ions into a workpiece, the workpiece having a surface defining a plane; scanning the ion beam relative to the surface of the workpiece in a first direction in the plane; repeatedly reciprocating the workpiece in a second direction transverse to said first direction to traverse to and fro through said scanned ion beam; and rotating said workpiece 180 degrees about a central axis of the workpiece between each successive traverse of the wafer through the scanned ion beam, so that the wafer always presents the same leading edge to the beam on each traverse.

Additionally, according to the invention an apparatus is provided for ion implantation of a workpiece in an ion implanter, comprising an ion beam generator for generating an ion beam for implantation of ions into a workpiece, the workpiece having a surface defining a plane; an ion beam scanner for scanning the ion beam relative to the surface of the workpiece in a first direction in the plane; and an arm assembly for repeatedly reciprocating the workpiece in a second direction transverse to said first direction to traverse to and fro through said scanned ion beam, said arm assembly comprising a rotational drive mechanism for rotating said workpiece about a central axis of the workpiece, and a controller arranged to operate said rotational drive mechanism to rotate the workpiece 180 degrees between each successive traverse of the wafer through the scanned ion beam, so that the wafer always presents the same leading edge to the beam on each traverse.

This arrangement provides sufficient time between each traverse or sweep of the workpiece through the scanned ion beam for heat to dissipate at points on the surface of the wafer near the trailing edge of the wafer. Accordingly, during successive sweeps, the maximum temperature reached at any point on the surface of the wafer is substantially minimized and the thermal cycle at any point on the surface of the wafer is substantially the same, which substantially reduces the risk of damage to the structures on the surface of the wafer.

BRIEF DESCRIPTION OF THE DRAWINGS

Examples of embodiments of the present invention will now be described with reference to the drawings in which:

FIG. 4 is a graph showing the variation of wafer surface temperature of the scanning arrangement shown in FIG. 2.

DETAILED DESCRIPTION

Figure 1:
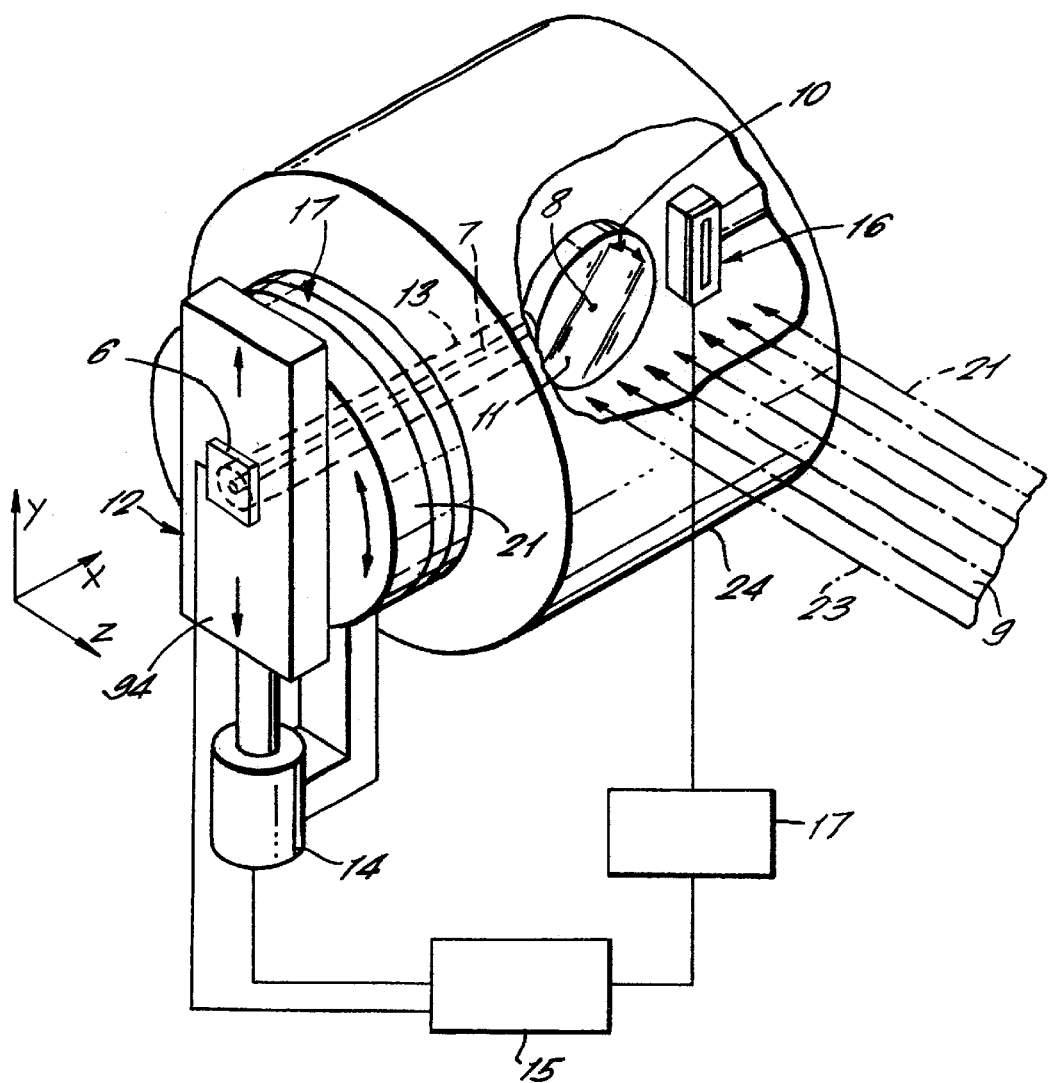
FIG. 1 shows a perspective view of an ion implantation device.

FIG. 1 shows a ion implantation device 1, and in particular a scanning arm assembly, for use in an ion implanter. Ion implanters generally comprise an ion beam generator (not shown) for generating a beam of ions, and means (not shown) for selecting a particular species of ions in the ion beam and for directing the ion beam through a vacuum chamber 24 onto a wafer or substrate supported by a wafer holder. A wafer holder 10 supporting a wafer 11 is shown in the scanning arm assembly 1 of FIG. 1. The scanning arm assembly 1, and methods of using such a scanning arm assembly in ion implanters, is described in detail in co-pending International Patent Publication No. WO 99/13488 which is incorporated herein by reference. The scanning arm assembly depicted in FIG. 1 is referred for illustrative purposes, and embodiments of the invention may be provided in other scanning arm assemblies such as, for example, those disclosed in U.S. Pat. Nos. 5,003,183 and 5,229,615.

The scanning arm assembly 1 mechanically scans the wafer 11 relative to the ion beam 9 in combination with electrostatic and/or magnetic deflection of the ion beam 9 by a scanner in the ion implanter. The surface of the wafer 11 defines an XY plane. The ion beam 9 is directed towards the substrate along the Z direction and is magnetically or electrostatically swept back and forth by the scanner in the ion implanter in the X direction perpendicular to the XY plane from one position 21 to another position 23 of the scan. The wafer holder 10 is mounted on one end of a scanning arm 13 and the scanning arm is mounted on a bearing assembly 12,17. The scanning arm 13 additionally has rotational drive system 6,7 to controllably rotate the wafer holder 13 and the wafer thereon about the central axis 8 of the wafer along the Z direction. The rotational drive system may include a motor 6 which is located on the bearing assembly to actuate a mechanical linkage assembly 7, located in the scanning arm 13, for linking the motor 6 to the wafer holder and rotating the wafer holder 10. Such a mechanical linkage assembly may be a belt or chain drive mechanism or the like. The linear bearing member 12 on the rotating bearing member 17 is connected to a drive motor 14. The drive motor 14 and the rotational drive system 6,7 are both connected to and controlled by a microprocessor/controller 15. The controller 15 is electrically connected to a Faraday cup 16 via a current integrator 17. The Faraday cup is mounted in the chamber 24 in such a position relative the wafer and the ion beam to collect and monitor the ion current at periods when the ion beam sweeps past the wafer edge during the electrostatic or magnetic deflection of the ion beam, such as at position 21 of the ion beam scan.

Figure 2:
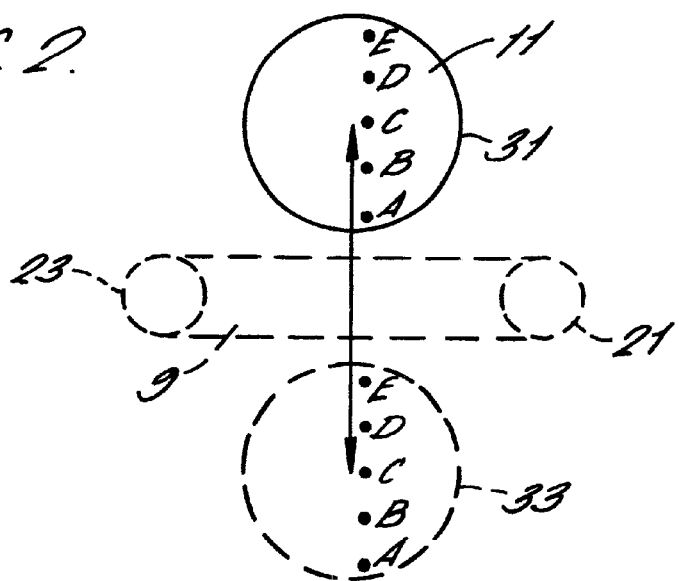
FIG. 2 shows a front view of a scanning arrangement.

During processing, the wafer 11 is mechanically scanned and reciprocated in the Y direction through the ion beam, as shown in FIG. 2. The wafer may be mechanically scanned at a speed, for example, in the range of about 0.5 to 1 Hz.

FIG. 4 is a graph showing the variation of surface temperature over four sweeps at five points A,B,C,D,E on the wafer 11 surface when scanning without practicing the present invention as shown in FIG. 2. Points $A_1,B_1,C_1,D_1,E_1$ represent the temperature readings at points A,B,C,D,E during a first sweep of the wafer 11. Similarly, the other points on the graph represent the temperature readings at the points indicated on the surface of the wafer during each respective sweep of the wafer.

In FIG. 2, after each sweep the trailing edge of the wafer 11 is the leading edge of the wafer for the next sweep. The point A nearest the leading edge and point E is nearest the trailing edge of wafer with orientation 31. After the first wafer sweep, the wafer has an orientation 33 and when the mechanical Y scanning reverses, point E is nearest the leading edge and point A is nearest the trailing edge for the second wafer sweep.

As shown in the graph of FIG. 4, at point $E_2$ there is a higher temperature reading at the surface point E on the wafer surface than at other points during the second sweep. This arises because heat from the first sweep at point E, which is near the trailing edge for wafer orientation 31, has not had as long to dissipate before the second sweep, when point E on the wafer is near the leading edge for wafer orientation 33, as other points on the wafer. Similarly, the temperature at point A on the surface during the second scan shows that, as A was the leading edge for wafer orientation 31 of the first scan and the trailing edge for wafer orientation 33 for the second scan, greater time elapsed to allow for the heat at point A to dissipate after the first sweep, compared with other points on the wafer.

As can be seen from the graph edge points A and E on the wafer alternately reach significantly higher temperatures than the centre point C for which the elapsed time between each sweep through the beam is substantially constant.

Figure 3:
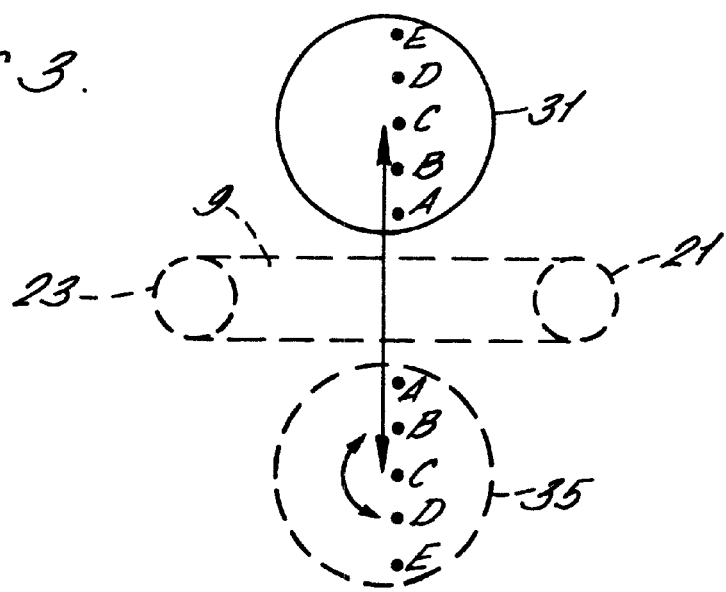
FIG. 3 shows a front view of a scanning arrangement embodying the invention.

FIG. 3 shows the wafer 11 with an orientation 35 that differs from orientation 33 as shown in FIG. 2, due to practising the present invention. The wafer has an orientation 31 with point A nearest the leading edge and point E nearest the trailing edge. After the wafer has cleared the ion beam 9 at the end of the first sweep, the wafer 11 is rotated about the central axis 180 degrees prior to the second sweep. Referring to FIG. 1, at this stage, the controller 15 detects that the wafer is out of the ion beam and controls the motor 6 which actuates the mechanical linkage assembly 7, to controllably rotate the wafer holder 13, and thus the wafer thereon, about the central axis 8 of the wafer. In this manner, the wafer is mechanically scanned with point A nearest to the leading edge for each sweep. With the wafer oriented such that point A is nearest the leading edge of the wafer during each sweep, the time each point A,B,C,D,E on the surface of the wafer is out of the beam between sweeps is substantially the same. Thus, the graph plot of point C in FIG. 4 is representative of the variation of surface temperature over successive sweeps for each of the five surface points A,B,C,D,E on the wafer 11.

Rotating the wafer 180 degrees between successive sweeps provides sufficient time for heat to dissipate at points on the surface of the wafer near the trailing edge of the wafer. The maximum temperature reached at the edge points (A and E) on the surface of the wafer during successive sweeps is substantially reduced. Additionally, any point (e.g. A,B,C,D,E) on the surface of the wafer experiences substantially the same thermal cycle on each scan during successive sweeps. In practice, this may permit the implant process to proceed more quickly with a greater total power dissipation into the wafer, i.e. higher beam current for a particular implant energy.

Further modifications to the embodiments described herein will be apparent to those skilled in the art.

What is claimed is:

1. A method for ion implantation of a workpiece in an ion implanter, comprising the steps of:
    generating an ion beam for implantation of ions into a workpiece, the workpiece having a surface defining a plane;
    scanning the ion beam relative to the surface of the workpiece in a first direction in the plane;
    repeatedly reciprocating the workpiece in a second direction transverse to said first direction to traverse to and fro through said scanned ion beam; and
    rotating said workpiece 180 degrees about a central axis of the workpiece between each successive traverse of the wafer through the scanned ion beam, so that the wafer always presents the same leading edge to the beam on each traverse.

2. The method of claim 1 wherein said beam scanning step is magnetic deflection of the ion beam.

3. The method of claim 1 wherein beam scanning step is electrostatic deflection of the ion beam.

4. An apparatus for ion implantation of a workpiece in an ion implanter, comprising:
    an ion beam generator for generating an ion beam for implantation of ions into a workpiece, the workpiece having a surface defining a plane;
    an ion beam scanner for scanning the ion beam relative to the surface of the workpiece in a first direction in the plane; and an arm assembly for repeatedly reciprocating the workpiece in a second direction transverse to said first direction to traverse to and fro through said scanned ion beam, said arm assembly comprising a rotational drive mechanism for rotating said workpiece about a central axis of the workpiece, and a controller arranged to operate said rotational drive mechanism to rotate the work piece through 180 degrees between each successive traverse of the wafer through the scanned ion beam, so that the wafer always presents the same leading edge to the beam on each traverse.

5. An apparatus for ion implantation of a workpiece in an ion implanter, comprising:

means for generating an ion beam for implantation of ions into a workpiece, the workpiece having a surface defining a plane;

means for scanning the ion beam relative to the surface of the workpiece in a first direction in the plane;

means for repeatedly reciprocating the workpiece in a second direction transverse said first direction so as to traverse to and fro through said scanned ion beam; and means for rotating said workpiece 180 degrees about a central axis of the workpiece between each successive traverse of the wafer through the scanned ion beam.

* * * * *